(12) United States Patent
Salter et al.

(10) Patent No.: US 11,543,190 B2
(45) Date of Patent: Jan. 3, 2023

(54) THERMAL MANAGEMENT APPARATUS

(71) Applicant: BAE Systems plc, London (GB)

(72) Inventors: Robert John Salter, Christchurch (GB); James Martin Miller, Christchurch (GB); Carl Martin Matthews, Christchurch (GB)

(73) Assignee: BAE Systems plc, London (GB)

( * ) Notice: Subject to any disclaimer, the term of this patent is extended or adjusted under 35 U.S.C. 154(b) by 0 days.

(21) Appl. No.: 17/634,609

(22) PCT Filed: Sep. 3, 2020

(86) PCT No.: PCT/GB2020/052103
§ 371 (c)(1),
(2) Date: Feb. 11, 2022

(87) PCT Pub. No.: WO2021/044142
PCT Pub. Date: Mar. 11, 2021

(65) Prior Publication Data
US 2022/0341678 A1    Oct. 27, 2022

(30) Foreign Application Priority Data

Sep. 5, 2019  (GB) ..................................... 1912771
Oct. 29, 2019 (EP) ..................................... 19275108

(51) Int. Cl.
*F28D 15/04* (2006.01)
*F28D 21/00* (2006.01)
*B64C 39/02* (2006.01)

(52) U.S. Cl.
CPC ............. *F28D 15/04* (2013.01); *F28D 21/00* (2013.01); *B64C 39/024* (2013.01); *B64C 2201/021* (2013.01); *F28D 2021/0021* (2013.01)

(58) Field of Classification Search
CPC .... F28F 27/02; B64D 13/006; F28D 15/0208; F28D 15/06; F28D 15/04; F28D 21/00;
(Continued)

(56) References Cited

U.S. PATENT DOCUMENTS 3,837,394 A * 9/1974 Roberts, Jr. ............. F28D 15/02
165/47
4,026,348 A * 5/1977 Roberts, Jr. ............. F28D 15/06
165/274
(Continued)

FOREIGN PATENT DOCUMENTS

CN         108306079 A    7/2018
EP           2589537 A1    8/2013
(Continued)

OTHER PUBLICATIONS

International Preliminary Report on Patentability of PCT Application No. PCT/GB2020/052103, dated Mar. 17, 2022, 12 pages.
(Continued)

*Primary Examiner* — Tho V Duong
(74) *Attorney, Agent, or Firm* — Maine Cernota & Rardin

(57) ABSTRACT

There is provided a thermal management apparatus for use with a vehicle comprising: a chassis in thermal contact with one or more first components that require thermal management and one or more second components that require thermal management, wherein the chassis is configured to transfer heat from the one or more first components to the one or more second components.

14 Claims, 4 Drawing Sheets

(58) Field of Classification Search
CPC ............ F28D 2021/0021; B64G 1/506; B64C 39/024
See application file for complete search history.

(56) References Cited

U.S. PATENT DOCUMENTS

| | | | | |
|---|---|---|---|---|
| 4,033,406 | A | * | 7/1977 | Basiulis .................. F28D 15/06 165/274 |
| 4,137,964 | A | * | 2/1979 | Buckley ................. G05D 23/01 165/104.19 |
| 4,162,701 | A | * | 7/1979 | Ollendorf ........... F28D 15/0275 165/274 |
| 4,388,964 | A | * | 6/1983 | Almgren .................. B64G 1/50 165/104.31 |
| 5,771,967 | A | * | 6/1998 | Hyman .................... B64G 1/50 126/45 |
| 6,073,888 | A | | 6/2000 | Gelson et al. |
| 10,207,804 | B1 | | 2/2019 | Gentry |
| 2006/0090882 | A1 | | 5/2006 | Sauciuc |
| 2013/0283816 | A1 | | 10/2013 | Smith |
| 2016/0128227 | A1 | | 5/2016 | Gernert |
| 2017/0277235 | A1 | | 9/2017 | Delano |
| 2018/0170553 | A1 | | 6/2018 | Wang et al. |
| 2018/0257760 | A1 | | 9/2018 | Lutke |

FOREIGN PATENT DOCUMENTS

| | | |
|---|---|---|
| EP | 2781380 A1 | 9/2014 |
| GB | 2190737 A | 11/1987 |
| WO | 2004100289 A2 | 11/2004 |
| WO | 2008136880 A1 | 11/2008 |
| WO | 2016099785 A1 | 6/2016 |

OTHER PUBLICATIONS

PCT International Search Report of PCT Application No. GB/2020/052103, dated Oct. 15, 2020, 6 pages.
European Search Report Application No. 19275108.9, dated Apr. 29, 2020, 11 pages.
Great Britain Search Report Application No. 1912771.1, dated Feb. 18, 2020, 5 pages.

* cited by examiner

THERMAL MANAGEMENT APPARATUS

RELATED APPLICATIONS

This application is a national phase application filed under 35 USC § 371 of PCT Application No. PCT/GB2020/052103 with an International filing date of Sep. 3, 2020, which claims priority of GB Patent Application 1912771.1 filed Sep. 5, 2019 and EP Patent Application 19275108.9 filed Oct. 29, 2019. Each of these applications is herein incorporated by reference in its entirety for all purposes.

FIELD OF THE INVENTION

The present invention relates to a thermal management apparatus, a vehicle and a method of thermal management in a thermal management apparatus.

BACKGROUND

High altitude long endurance (HALE) unmanned aircraft have been devised. These typically have long wingspans and low drag to improve their ability to operate efficiently for weeks or months at altitudes in excess of 15 km. In some examples, HALE aircraft include one or more payloads comprising electronic components, such as sensors.

Operating at relatively low speeds and at high altitudes, airflow over the aircraft's surfaces is low. Therefore, it is difficult to effectively remove heat generated by electronic components. In some examples, the components have different operating temperature ranges and so it can be difficult to ensure that each of the components are working within their operating temperature range.

It would not be appropriate to fit an air conditioning unit or an arrangement of pumps and/or fans to a vehicle with stringent weight requirements, such as a HALE aircraft or a racing car.

Therefore, there is a need for a lightweight means for managing heat for one or more components.

SUMMARY

According to one aspect, there is provided a thermal management apparatus for use with a vehicle. The apparatus comprises a chassis in thermal contact with one or more first components that require thermal management and one or more second components that require thermal management, wherein the chassis is configured to transfer heat from the one or more first components to the one or more second components.

A thermal management apparatus that comprises a chassis to transfer heat from one or more first components to the one or more second components provides a lightweight means to regulate the heat of components. For example, excess heat generated by the one or more first components can be used to heat one or more second components, as required. Further, as the chassis is providing the thermal management, the overall weight of a vehicle including this apparatus is reduced as there is no requirement for a separate heat regulation system.

In one example, the chassis is a hollow tube.

Fluid may be configured to flow through the hollow tube to transfer heat from the one or more first components to the one or more second components.

In one example, the fluid is air that can be used to aid with the transfer of heat from the one or more first components to the one or more second components.

The thermal management apparatus may include one or more heaters configured to add heat to the chassis. The one or more heaters may be used to provide additional heat to the chassis and the one or more first components and the one or more second components.

In one example, the thermal management apparatus comprises a coating configured to radiate excess heat from the chassis. The coating is used when there is too much heat in the chassis, the one or more first components and the one or more second components.

The thermal management apparatus may include the one or more first components; and the one or more second components, wherein the one of more first components have a first power output; and the one or more second component have a second set power output, wherein the first power output is higher than the second power output.

In one example, the thermal management comprises one or more first temperature sensors to measure the temperature of the one or more first components; and one or more second temperature sensors to measure the temperature of the one or more second components.

The thermal management apparatus may comprise a flow control unit for modifying the flow path for the chassis; and a controller configured to receive the temperature of the one or more first components and the temperature of the one or more second components and generate a control signal for the flow control unit to modify the flow path. In some examples, the flow control unit comprises one or more controllable valves that may be configured to adjust the amount or direction of fluid that may flow through the chassis.

In one example, the thermal management apparatus comprises a heat pipe in addition to the chassis.

The heat pipe may include an evaporator end and a condenser end; a vapour arranged to flow from the evaporator end to the condenser end; and a working fluid arranged to flow from the condenser end to the evaporator end, wherein the heat pipe is arranged such that the evaporator end is arranged in proximity to the one or more first components to absorb heat from the one or more first components; and wherein the condenser end is arranged in proximity to the one or more second components to transfer heat to the one or more second components. The provision of a heat pipe in addition to the chassis provides an additional means for transferring heat from the one or more first components to the one or more second components.

In one example, the thermal management apparatus comprises: translation means for causing the heat pipe to translate from a first configuration to a second configuration in response to a control signal, wherein in the first configuration the evaporator end is arranged in proximity to the one or more first components and in the second configuration the evaporator end is arranged at a greater distance from the one or more first components than in the first configuration.

In one example, the heat pipe is telescopic and wherein the translation means comprises means for selectively extending or contracting the heat pipe such that the evaporator end respectively moves toward or away from the one or more first components.

The thermal management apparatus may comprise a switch for modifying the flow of vapour along the heat pipe in response to a control signal to increase or decrease the rate of heat loss from the one or more first components.

According to one aspect, there is provided a vehicle comprising the thermal management apparatus as described above. The vehicle may be vehicle a High Altitude Long Endurance aircraft. High Altitude Long Endurance aircraft are subject to very tight weight restrictions and so repurposing heat from the one or more first components to heat the one or more second components removes the requirement for additional air conditioning or heating systems.

According to one aspect, there is provided a method of thermal management in a thermal management apparatus, comprising: measuring the temperature of one or more first components; measuring the temperature of one or more second components; transferring heat from the one or more first components to the one or more second components based on the temperature of the one or more first components and the temperature of the one or more second components.

The method may include the steps of: generating a control signal for controlling a flow control unit in dependence on the measured temperatures; and controlling the flow control unit to modify the flow path of the chassis in response to the control signal to increase or decrease the rate of heat loss from the one or more first components.

The method may include the steps of generating a control signal for controlling a switch in dependence on the measured temperature; and controlling the switch to modify a flow path of vapour along the heat pipe in response to the control signal to increase or decrease the rate of heat transfer from the one or more first components to the one or more second components.

It will be appreciated that features described in relation to one aspect of the present invention can be incorporated into other aspects of the present invention. For example, an apparatus of the invention can incorporate any of the features described in this disclosure with reference to a method, and vice versa. Moreover, additional embodiments and aspects will be apparent from the following description, drawings, and claims. As can be appreciated from the foregoing and following description, each and every feature described herein, and each and every combination of two or more of such features, and each and every combination of one or more values defining a range, are included within the present disclosure provided that the features included in such a combination are not mutually inconsistent. In addition, any feature or combination of features or any value(s) defining a range may be specifically excluded from any embodiment of the present disclosure.

According to one aspect, there is provided a method of manufacturing a thermal management apparatus, comprising: providing a chassis; thermally coupling one or more first components that require thermal management with a first position of the chassis; and thermally coupling one or more second components that require thermal management with a second position of the chassis, wherein in use the chassis is configured to transfer heat from the one or more first components to the one or more second components.

The method of manufacturing a thermal management apparatus may include the steps of providing one or more first temperature sensors to measure the temperature of the one or more first components; providing one or more second temperature sensors to measure the temperature of the one or more second components; providing a flow control unit for modifying the flow path for the chassis; and providing a controller configured to receive the temperature of the one or more first components and the temperature of the one or more second components and generate a control signal for the flow control unit to modify the flow path for the chassis.

BRIEF DESCRIPTION OF THE DRAWINGS

Embodiments of the invention will now be described by way of example only and with reference to the accompanying drawings.

For convenience and economy, the same reference numerals are used in different figures to label identical or similar elements.

DETAILED DESCRIPTION

Embodiments herein generally relate to a thermal management apparatus for use with a vehicle. The thermal management apparatus includes a chassis with one or more components thermally coupled with the chassis. For example, there may be one or more first components and one or more second components.

The chassis is arranged to regulate heat for the one or more first components and the one or more second components. For example, the chassis is arranged to remove heat from the one or more first components and transfer the heat to one or more second components. As such, the chassis is able to effectively repurpose heat, that otherwise would have been lost from the apparatus and use it to heat the one or more second components.

The chassis is configured to draw heat away from the one or more first components, which may be sources of heat within the vehicle, such as sensors, imaging systems and moving parts that generate heat through friction.

Prior art thermal management systems for vehicles include, for example, radiators for cooling engines on cars or coolant systems powered by an auxiliary power unit for avionics bays in aircraft. These tend to be relatively heavy and complex systems and so are undesirable to include vehicles that have weight restrictions.

Figure 1:
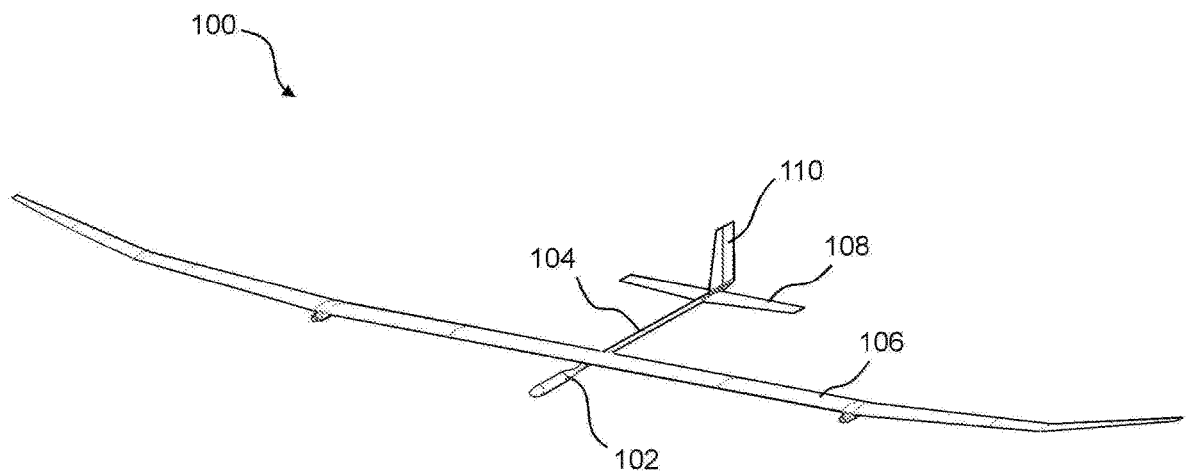
FIG. 1 is a perspective view of an aircraft.

FIG. 1 shows an illustrative example of an aircraft 100, specifically a HALE unmanned aeroplane. While an aircraft 100 is shown here, it would be readily appreciated that the present invention is applicable to other types of vehicles, such as cars, ships, spacecraft, airships and trains. The present invention is particularly applicable to vehicles operate in environments where there is limited air flow. Further this invention is also particular applicable to vehicles that have burdensome weight restrictions, as the thermal management apparatus described herein tends to be relatively light weight and may use existing components for thermal management. The aircraft 100 includes a wing member 106. In one example, the wing span of the wing member 106 is approximately 35 metres and has a relatively narrow chord (i.e. of the order 1 metre). The wing member 106 is coupled to a fuselage 104. To aerodynamically balance the aircraft 100, a horizontal tail plane 108 and a vertical tail fin (or vertical stabilizer) 110 are coupled to the rear of the fuselage 104. A payload module 102 may be coupled to the front of the fuselage 104, i.e. the nose of the aircraft 100. In one example, the payload module 102 is detachable from the fuselage 104. The payload module 102 may be a pod that includes one or more first components and one or more second components that require thermal management, which is described in more detail below.

An engine having a propeller is mounted to the wing member 106 on both sides of the fuselage 104. The engines are powered by a combination of solar panels mounted to the upper surfaces of the wing member 106 and batteries disposed inside the fuselage 104 and/or wing member 106.

The aircraft 100 is of lightweight construction. For example, the fuselage 104, wing member 106, payload module 102, tailplane 108 and tail fin 110 may be made of a monocoque carbon fibre laminate skin structure. In other words, the skin forms the aircraft's body. In other embodiments, the body is substantially made of a light weight metal, such as titanium, titanium alloy, aluminium or aluminium alloy.

Figure 2:
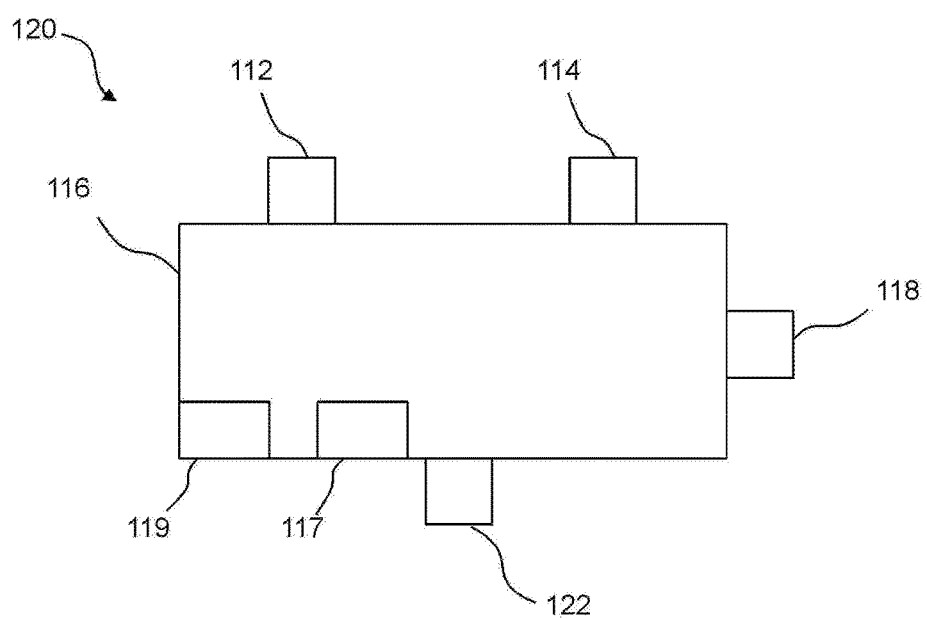
FIG. 2 is a schematic diagram of a thermal management apparatus for use with a vehicle according to embodiments of the present invention.

FIG. 2 shows a schematic diagram of a thermal management apparatus 120 for use with a vehicle, such as the aircraft 100. FIG. 2 shows an example of a thermal management apparatus 120 comprising a chassis 116 that is thermally coupled with one or more first components 112 and one or more second components 114.

In one example, the thermal management apparatus 120 is part of the payload module 102 of a vehicle, such as an aircraft 100. In some examples, the payload module 102 is a pod coupled to a front of a vehicle and includes the thermal management apparatus 120. In other examples, the payload module 102 is the thermal management apparatus 120. In some examples, the payload module 102 includes one or more first components 112 and one or more second components 114. In some examples, the one or more first components 112 and one or more second components 114 are part of the thermal management apparatus 120 itself.

Whilst both the one or more first components 112 and the one or more second components 114 may generate heat, in some examples, the one or more second components 114 may require additional heat in order to work effectively. For example, the aircraft 100 may be deployed at a high altitude so the temperature and pressure of the surrounding air may be very low. As such, one or more second components 114, such as camera equipment, may require additional heat to operate effectively and/or to prevent a reduction in their performance. The one or more first components 112 may have a higher power output compared with the one or more second components 114 and so the one or more first components 112 may generate more heat compared with the one or more second components 114.

As mentioned above, the thermal management apparatus 120 is thermally coupled with one or more first components 112 that generate heat when in operation. For example, a processor, batteries or radio equipment may all generate heat whilst in use. Due to the relatively low airspeed of air crossing the surfaces of the aircraft 100, and the low air density at the high altitudes at which it tends to operate, it can be difficult to draw heat away from the aircraft 100. It is important to draw heat away from heat sources, such as the one or more first components 112, at least in some circumstances, to prevent damage to components of the aircraft 100 or to prevent a reduction in their performance.

The chassis 116 of the thermal management apparatus 120 is thermally coupled with both the one or more first components 112 and the one or more second components 114 and is configured to draw heat away from the one or more first components 112 and transfer at least some of the heat drawn from the one or more first components 112 to the one or more second components 114. Heat may be drawn away from the one or more first components 112 via conduction, convection or radiation and transferred to the one or more second components via conduction, convection or radiation. In some examples, the chassis 116 of the thermal management apparatus 120 is configured to substantially equalise the temperature of the one or more first components 112 and the one or more second components 114. Further, the chassis 116 is configured to provide heat to the one or more second components 114 that require heating.

In one example, the thermal management apparatus 120 includes one or more temperature sensors 118. The one or more temperature sensors 118 may be configured to determine the temperature of the one or more first components 112 and the temperature of the one or more second components 114. In one example, the one or more temperature sensors 118 may comprise a first set of temperature sensors to measure the temperature of the one or more first components 112 and a second set of temperature sensors to measure the temperature of the one or more second components 114, even if they have different power outputs.

In one example, the thermal management apparatus 120 includes one or more heaters 122 in order to provide a supplemental heating to the one or more first components 112 and/or the one or more second components 114 if the heat generated by the one or more first components 112 is not sufficient to effectively heat the one or more second components 114 to their required operating temperature. However, in other examples, the thermal management apparatus 120 does not include any additional heaters 118 or cooling elements further to the chassis 116. One or more of the first components 112 or second components 112 may be heat radiating devices, which thereby act as heat sinks.

In one example, the one or more first components 112 are physically coupled to the chassis 116 of the thermal management apparatus 120. The chassis 116 is, in effect a supporting frame for the one or more first components 112. The one or more second components 114 may also be physically coupled to chassis 116 of the thermal management apparatus 120. For example, the one or more first components 112 may be releasably attached to the chassis 116 of the thermal management apparatus 120 and the one or more second components 114 may also be releasably attached to chassis 116 of the thermal management apparatus 120. In other examples, the one or more first components 112 are fixed to the chassis 116 of the thermal management apparatus 120 and the one or more second components 114 are fixed to chassis 116 of the thermal management apparatus 120.

In one example, the chassis 116 of the thermal management apparatus 120 is substantially hollow such that a fluid, such as air, may flow through a flow path in the chassis 116 of the thermal management apparatus 120. In this example, the one or more first components 112 may be located "upstream" of the one or more second components 114. In this example, heat may be drawn from the one or more first components 112 via convection or radiation to the fluid. Then as the fluid passes the one or more second components 114, heat may be transferred from the fluid to the one or more second components 114. In one example, the chassis 116 is formed of a hollow tube. In this example, the one or more first components 112 and the one or more second components 114 may be coupled or attached to an outside surface of the hollow tube chassis 116.

In one example, the thermal management apparatus 120 comprises a coating configured to radiate excess heat from the chassis 116. In one example, an outside surface of the chassis 116 includes a coating configured to substantially reflect light. The chassis 116 may be coated in a black paint.

The provision of the coating allows maximum heat dissipation in the target environment by radiating any excess heat generated by the one or more first components 112 that is not required by the one or more second components 114. In other words, if the one or more first components 112 are at a temperature higher than a first threshold (e.g., the operating temperature of the one or more first components 112) and the one or more second components 114 are at a temperature higher than a second threshold (e.g., the operating temperature of the one or more second components 112), then the chassis 116 may act as a heat sink for the one or more first components 112 and the one or more second components 114.

Figure 3:
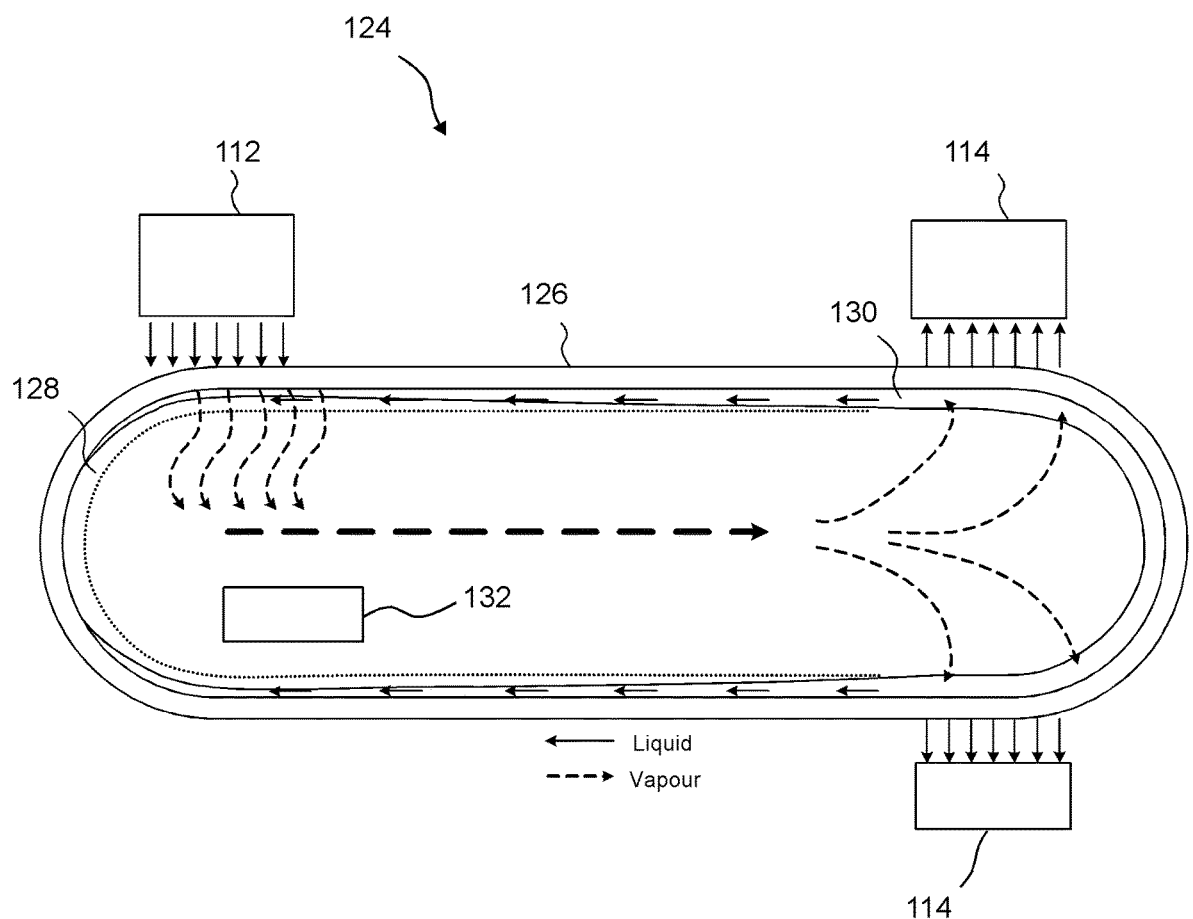
FIG. 3 is system diagram of a heat pipe according to embodiments of the present invention.

In one example, the thermal management apparatus 120 also includes a heat pipe 124 in addition to the chassis 116 for drawing heat away from the one or more first components 112 and transferring the heat to the one or more second components 114. An example of a heat pipe 124 is shown in more detail in FIG. 3. The heat pipe 124 may provide an additional means for transferring heat from the one or more first components 112 to the one or more second components 114.

In this example, the heat pipe 124 is a passive elongate sealed heat-transfer device that combines the principles of both thermal conductivity and phase transition to effectively transfer heat between two solid interfaces. The heat pipe 124 would be familiar to someone skilled in the art of manufacturing microelectronics and relatively small electronic consumer devices, for example, but not generally to someone designing a vehicle, particularly an aircraft 100.

The heat pipe 124 comprises a vacuum-tightened vessel 126, porous wick structure 128, and working fluid 130. The wick structure 128 is arranged on the inside of the vessel 126 at the end of the heat pipe 124 proximate to the one or more first components 112. This end of the heat pipe 124 functions as an evaporator. As heat from the one or more first components 112 is input at the evaporator end, the fluid 130 vaporises, creating a pressure gradient. This pressure gradient pushes the vapour to flow along the heat pipe 124, through the central channel, to the condenser end (i.e. the end proximate the one or more second components 114) where it condenses due to this end being cooler, giving up its latent heat of vaporisation. The working fluid 130 is then returned to the evaporator end by capillary forces developed in the wick structure 128 or by gravity.

The vessel 126 (i.e. main body) of the heat pipe 124 comprises a material having high strength and high thermal conductivity, such as copper or aluminium. The working fluid 130 comprises a fluid having high latent heat and high thermal conductivity, such as liquid helium, ammonia, alcohol or ethanol. In a preferred embodiment, liquid helium is used as the working fluid 130 as it is efficient at the ambient temperatures in which a HALE aircraft will typically operate, for example down to −70 degrees Celsius. The wick structure 128 maintains effective capillary action when bent or used against gravity. The wick structure 128 comprises, for example, sintered copper powder, screen or a series of grooves parallel to the longitudinal axis of the heat pipe 124.

The evaporator end of the heat pipe 124 is disposed in proximity to the one or more first components 112. The opposite end (i.e. the condenser end) of the heat pipe 124 is disposed in proximity to the one or more second components 114. In some examples, the condenser end of the heat pipe 124 is bifurcated such that one branch of the condenser end is disposed adjacent a first set of one or more second components 114 and another branch of the condenser end is disposed adjacent a second set of one or more second components 114. In the embodiment shown in FIG. 3, the heat pipe 124 is not bifurcated. In the example shown in FIG. 3, there is one first component 112 from which heat is removed and then delivered to two second components 114.

The heat pipe 124 may be used in addition to the chassis 116 to provide an additional means of transferring heat from the one or more first components 112 to the one or more second components 114. However, the heat pipe 124 comes with a weight disadvantage, and so in one example, the thermal management apparatus 120 includes a chassis 116 without an additional heat pipe 124.

Further, the evaporator end of the heat pipe 124 may be bifurcated, or further divided, to approach the one or more first components 112 from different directions or to allow a single heat pipe 124 to be used to transport heat away from a plurality of first components 112.

Figure 4:
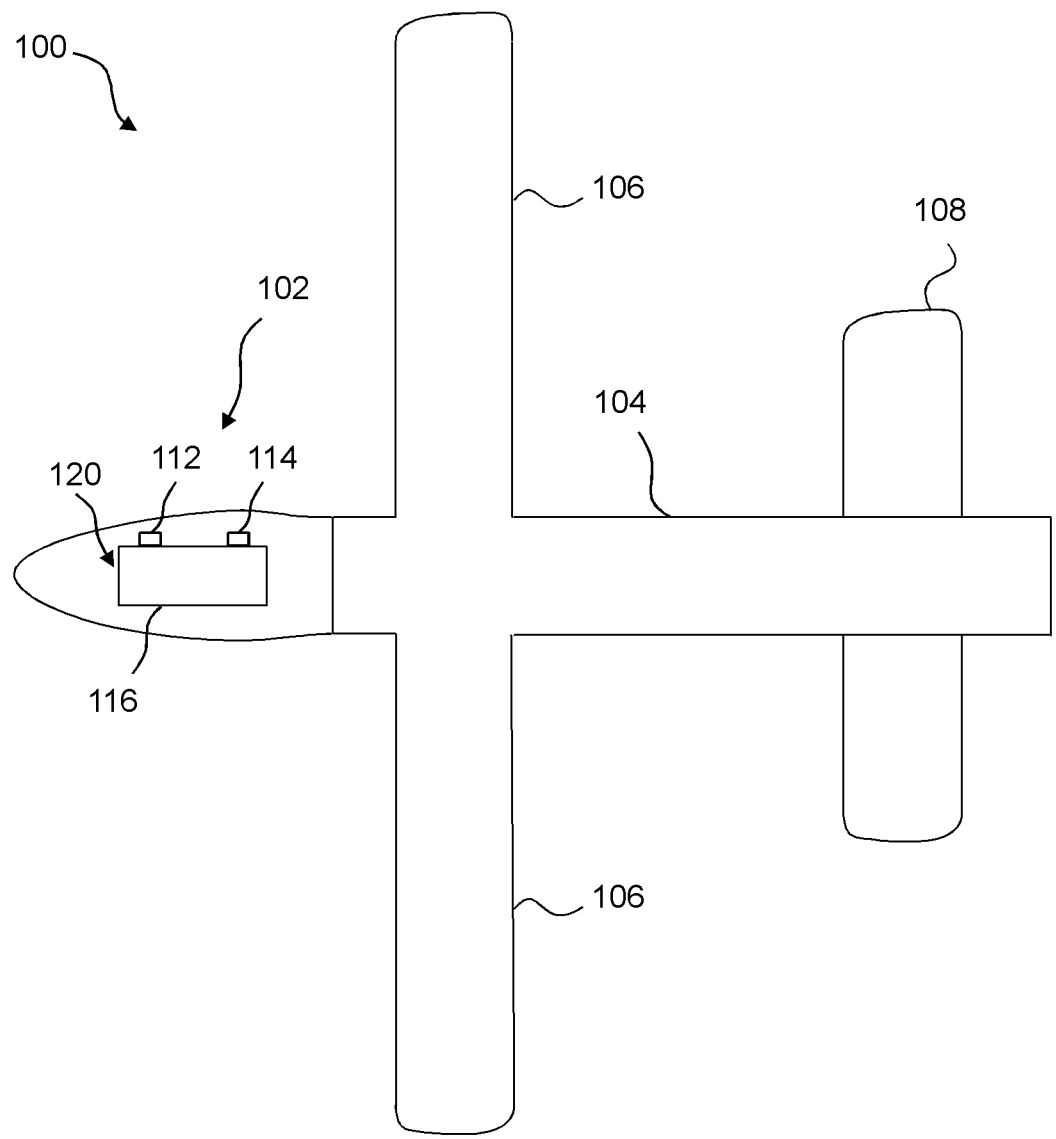
FIG. 4 is a plan view of an aircraft having a thermal management apparatus according to embodiments of the present invention.

FIG. 4 shows a plan view of a thermal management apparatus 120 implemented in an aircraft 100.

In this example, the thermal management apparatus 120 comprises a pod that is configured to couple with the vehicle. In the example shown in FIG. 4, the thermal management apparatus 120 is coupled to the front of the vehicle, but in other examples, the thermal management apparatus 120 is coupled to another part of the vehicle. In some examples, the thermal apparatus 120 is a part of the vehicle itself, for example, as described above, the thermal apparatus 120 may be the payload 102. In some example, the thermal management apparatus 120 may be coupled to a balloon.

In the example shown in FIG. 4, the chassis 116 acts as the physical interface between the one or more first components 112, the one or more second components 114 and the aircraft 100. This makes efficient use of the space, weight and power constraints associated with the operating environment.

In one example, the thermal management apparatus 120 includes a flow control unit 117 and a controller 119. The controller 119 may be part of the flow control unit 117, or a separate but electrically connected component.

The flow control unit 117 may include at least one controllable valve for directing fluid around or through the chassis 116. The one or more controllable valves may be adjusted to restrict the amount of fluid that passes through the chassis 116. In other words, the flow control unit 117 is configured to set or define a flow path in the chassis 116. In the example of the chassis 116 comprising a hollow member, such as hollow tube, then the flow control unit 117 may be configured to control the flow of fluid, such as air, through the hollow of the chassis 116. The flow control unit 117 may include one or more pivotable flaps that may adjust the flow path of fluid in the chassis. In other words, the flow control unit 117 has one or more movable parts to adjust the flow path through the chassis 116.

In the example in which the thermal management apparatus 120 also comprises the heat pipe 124, the controller 119 may be configured to control a switch 132 to control the flow of the heat transport medium (i.e. vapour and working fluid 130) to continue to flow along the heat pipe 124 from the one or more first components 112 toward or away from the one or more second components 114. The switch 132 may comprise a valve disposed in the heat pipe 124.

The valve in the heat pipe 124 may control the amount of heat transport medium that travels through the heat pipe 124. As such, the rate at which heat is drawn from the one or more first components 112 (i.e. the rate at which the one or more first components 112 is cooled) may be controlled.

The one or more temperature sensors 118 may be, for example, a thermocouple. The temperature sensor 118 may be incorporated onto a MEMS chip. In some embodiments one or more temperature sensors 118 may be integrated with the one or more first components 112 and/or the one or more second components 114. In other embodiments, the temperature sensor 118 is disposed adjacent to the one or more first components 112 and/or the one or more second components 114. The one or more temperature sensors 118 may be electrically coupled to the controller 119. The one or more temperature sensors 118 may transmit a continuous signal to the controller 119 indicative of the temperature of the one or more first components 112 and/or the one or more second components 114. In embodiments where there is a plurality of first components 112, there may be a plurality of temperature sensors 118, each associated with each first component 112. In embodiments where there is a plurality of second components 114, there may be a plurality of temperature sensors 118, each associated with each second component 114.

The controller 119 may take any suitable form. For instance, it may be a microcontroller, plural microcontrollers, a processor, or plural processors. The controller 119 may receive the signal indicative of temperature of the one or more first components 112 from the temperature sensor 118. The controller 119 may receive the signal indicative of temperature of the one or more second components 114 from the temperature sensor 118. The controller 119 may include a memory to store the measurements of the temperature sensor 118.

The controller 119 may compare the temperature of the one or more first components 112 with a first threshold temperature. The first temperature threshold may be indicative of an operating temperature (or a range of operating temperatures) in which the one or more first components 112 is configured to operate effectively.

The controller 119 may compare the temperature of the one or more second components 114 with a second threshold temperature. The second temperature threshold may be indicative of an operating temperature (or a range of operating temperatures) in which the one or more second components 114 is configured to operate effectively.

The controller 119 may process the received temperatures and generate a control signal to control the flow control unit 117 to change the flow rate of fluid through the chassis 116. In other examples, the controller 119 may generate a control signal for the switch 132 to control the flow of the heat transfer medium in the heat pipe 124 in dependence on the received temperatures.

For example, if the temperature of the one or more first components 112 is higher than the first threshold, then the controller 119 determines that the one or more first components 112 has generated excess heat.

Further, if the temperature of the one or more second components 114 is lower than the second threshold, then the controller determines that that the one or more second components 114 requires additional heat.

The controller 119 may generate a control signal for the flow control unit 117 to modify the flow path of fluid in the chassis 116 such that heat loss from the one or more first components 112 is promoted and heat is transferred from the one or more first components 112 to the one or more second components 114.

This may be advantageous where a system on-board the aircraft 100 has several components that operate at different powers and temperatures. For example, Commercial Off the Shelf (COTS) derived equipment (e.g. optics, router or radios) may not be able to operate correctly or effectively at the altitudes (i.e. low temperatures) HALE aircraft typically operate at. It may further be desirable it limit the rate of heat loss from the vehicle as some excess heat is re-purposed and used to heat one or more second components 114 that require heating.

Where the temperature of the one or more second components 114 exceeds the second threshold (i.e. reaches its operating temperature), then the controller 119 may generate a control signal for the flow control unit 117 to modify the flow path of fluid in the chassis 116 such that less heat is transferred from the one or more first components 112 to one or more second components 114 so that the one or more second components are not heated too much.

In some embodiments, the switch 132 is a mechanism for physically moving the evaporator end of the heat pipe 124 away from the one or more first components 112 such that less heat is drawn away from the one or more first components 112. In one embodiment, the heat pipe 124 is telescopic. Here, the switch 132 comprises a motor for driving the heat pipe 124 to extend or contract in response to a control signal from the controller 119. In other words, the controller 119 receives a temperature measurement from the one or more temperature sensors 118. If the measured temperature of the one or more first components 112 is less than a threshold, indicating that the one or more first components 112 is too cold, the controller 119 generates a control signal for the switch 132 to retract (or contract) the heat pipe 124 to move the evaporator end away from the one or more first components 112.

If the controller 119 subsequently receives a temperature measurement from the one or more temperature sensors 118 indicating that the measured temperature of the one or more first components 112 is higher than a threshold, then the controller 119 generates a control signal for the switch 132 to extend the heat pipe 124 to move the evaporator end towards the one or more first components 112.

In an alternative embodiment again, the switch 132 comprises a pivot point or rotary hinge. It may comprise a rack and pinion or other gear arrangement for rotating the heat pipe 124 about the pivot point to move the evaporator end of the heat pipe 124 away from into proximity with the one or more first components 112. In an alternative embodiment again, the switch 132 comprises a sliding mechanism for relocating/repositioning the heat pipe 124.

Figure 5:
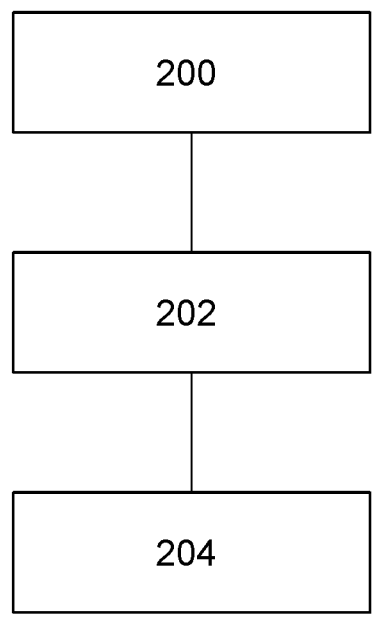
FIG. 5 is an example of a method of thermal management in a thermal management apparatus.

FIG. 5 shows an example of a method of managing the temperature in a heat transfer apparatus.

As step 200, the temperature of one or more first components 112 is measured.

At step 202, the temperature of one or more second components 114 is measured.

At step 204, heat is transferred from the one or more first components 112 to the one or more second components 114 based on the temperature of the one or more first components 112 and the temperature of the one or more second components 114.

Embodiments herein have described the thermal management apparatus with reference to an aircraft 100. However, it would be appreciated that other types of vehicular implementations are anticipated. For example, the lightweight construction of the thermal management apparatus is readily applicable to sports cars, for example Formula 1™ cars, or lighter-than-air vehicles, such as balloons.

A method of manufacturing a thermal management apparatus 120 is described below. A chassis 116 is provided. The chassis 116 may be formed from injection moulding, such as metal injection moulding. The chassis 116 is substantially hollow such that a fluid, such as air, may flow through a flow path in the chassis 116 of the thermal management apparatus 120. The chassis 116 may be extruded to the desired shape.

The method of manufacturing includes thermally coupling one or more first components 112 that require thermal management with a first position of the chassis 116. For example, one or more first components 112 that require heat to be removed from them are selected and thermally coupled with the chassis 116 at a first position, for example in an "upstream" position.

The method of manufacturing includes thermally coupling one or more second components 114 that require thermal management with a second position of the chassis 116. For example, one or more second components 112 that require heat to be added to them are selected and thermally coupled with the chassis 116 at a second position, for example in an "downstream" position relative to the one or more first components 112.

In this example, heat may be drawn from the one or more first components 112 via convection or radiation to the fluid. Then as the fluid passes the one or more second components 114, heat may be transferred from the fluid to the one or more second components 114. In one example, the chassis 116 is formed of a hollow tube. In this example, the one or more first components 112 and the one or more second components 114 may be coupled or attached to an outside surface of the hollow tube chassis 116 and fluid may pass through the hollow tube. As such, the chassis 116 is configured to transfer heat from the one or more first components 112 to the one or more second components 114.

The method of manufacturing a thermal management apparatus may include the steps of providing one or more first temperature sensors 118 to measure the temperature of the one or more first components 112 and providing one or more second temperature sensors 118 to measure the temperature of the one or more second components 114.

The method of manufacturing may include the steps of providing a flow control unit 117 for modifying the flow path for the chassis 116. For example, the flow control unit 117 may have movable parts that may modify flow through the chassis 116.

The method of manufacturing may include the step of providing a controller 119 configured to receive the temperature of the one or more first components 112 and the temperature of the one or more second components 114 and generate a control signal for the flow control unit to modify the flow path for the chassis 116.

Where, in the foregoing description, integers or elements are mentioned that have known, obvious, or foreseeable equivalents, then such equivalents are herein incorporated as if individually set forth. Reference should be made to the claims for determining the true scope of the present disclosure, which should be construed so as to encompass any such equivalents. It will also be appreciated by the reader that integers or features of the disclosure that are described as optional do not limit the scope of the independent claims. Moreover, it is to be understood that such optional integers or features, while of possible benefit in some embodiments of the disclosure, may not be desirable, and can therefore be absent, in other embodiments.

The invention claimed is:

1. A high altitude long endurance aircraft comprising:
   one or more first components and one or more second components, the one or more first components and second components requiring thermal management;
   a thermal management apparatus comprising:
      a chassis, in the form of a hollow tube, in thermal contact with the one or more first components and the one or more second components, the first components and second components being thermally coupled with the chassis;
      controllable valve configured to define a fluid flow path through the chassis;
      a temperature sensor arranged to measure the temperature of the one or more second components;
      a processor configured to compare the measured temperature of the one or more second components with a threshold temperature and, if the measured temperature is less than the threshold temperature, operate the controllable valve to permit a fluid to flow through the chassis to transfer heat from the one or more first components to the one or more second components; and
      a heat pipe, the heat pipe comprising:
         an evaporator end and a condenser end;
         a vapour arranged to flow from the evaporator end to the condenser end; and
         a working fluid arranged to flow from the condenser end to the evaporator end,
         wherein the heat pipe is arranged such that the evaporator end is arranged in proximity to the one or more first heat-generating components to absorb heat from the one or more first heat-generating components,
         wherein the condenser end is arranged in proximity to the one or more second components to transfer heat to the one or more second components, and
      wherein the heat pipe is configured to move between a first configuration and a second configuration in response to a control signal, wherein, in the first configuration, the evaporator end is arranged in proximity to the one or more first components and, in the second configuration, the evaporator end is arranged at a greater distance from the one or more first components than in the first configuration.

2. The high altitude long endurance aircraft according to claim 1, further comprising one or more heaters configured to add heat to the chassis.

3. The high altitude long endurance aircraft according to claim 1, wherein the chassis comprises a coating configured to radiate excess heat from the chassis.

4. The high altitude long endurance aircraft according to claim 1, wherein the one or more first components have a first power output; and the one or more second components have a second set power output, wherein the first power output is higher than the second power output.

5. The high altitude long endurance aircraft according to claim 1, further comprising one or more first temperature sensors configured to measure the temperature of the one or more first components.

6. The high altitude long endurance aircraft according to claim 1, wherein the heat pipe is telescopic and wherein the translation means comprises means for selectively extending or contracting the heat pipe such that the evaporator end respectively moves toward or away from the one or more first components.

7. The high altitude long endurance aircraft according to claim 1, further comprising a switch for modifying the flow of vapour along the heat pipe in response to a control signal to increase or decrease the rate of heat loss from the one or more first components.

8. The high altitude long endurance aircraft according to claim 2, wherein the chassis comprises a coating configured to radiate excess heat from the chassis.

9. The high altitude long endurance aircraft according to claim 8, further comprising: one or more first temperature sensors configured to measure the temperature of the one or more first components.

10. The high altitude long endurance aircraft according to claim 3, wherein the chassis comprises a coating configured to radiate excess heat from the chassis.

11. The high altitude long endurance aircraft according to claim 4, wherein the chassis comprises a coating configured to radiate excess heat from the chassis.

12. The high altitude long endurance aircraft according to claim 2, further comprising: one or more first temperature sensors configured to measure the temperature of the one or more first components.

13. The high altitude long endurance aircraft according to claim 5, further comprising: one or more first temperature sensors configured to measure the temperature of the one or more first components.

14. The high altitude long endurance aircraft according to claim 4, further comprising: one or more first temperature sensors configured to measure the temperature of the one or more first components.

\* \* \* \* \*